(12) United States Patent
Park et al.

(10) Patent No.: US 8,916,855 B2
(45) Date of Patent: Dec. 23, 2014

(54) ORGANIC LIGHT-EMITTING DISPLAY APPARATUS AND METHOD OF MANUFACTURING THE SAME

(71) Applicants: Sun Park, Yongin (KR); Yul-Kyu Lee, Yongin (KR); Kyu-Sik Cho, Yongin (KR); Ji-Hoon Song, Yongin (KR)

(72) Inventors: Sun Park, Yongin (KR); Yul-Kyu Lee, Yongin (KR); Kyu-Sik Cho, Yongin (KR); Ji-Hoon Song, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 13/653,752

(22) Filed: Oct. 17, 2012

(65) Prior Publication Data

US 2013/0306939 A1 Nov. 21, 2013

(30) Foreign Application Priority Data

May 18, 2012 (KR) ........................ 10-2012-0053162

(51) Int. Cl.
*H01L 51/00* (2006.01)
*H01L 29/04* (2006.01)

(52) U.S. Cl.
USPC ................ 257/40; 257/59; 257/72; 257/88; 257/E51.001; 257/E51.018; 313/483; 313/513; 313/506; 345/36; 345/44; 345/211; 345/204

(58) Field of Classification Search
CPC . H01L 27/1214; H01L 37/12; H01L 51/0545; G01F 3/016; G01R 13/405
USPC ................... 257/13, 40, 59, 72, 88, E51.001, 257/E51.018, E51.022, E27.001; 313/397, 313/483, 504, 506, 513; 345/156, 204, 211, 345/36, 44
See application file for complete search history.

(56) References Cited

U.S. PATENT DOCUMENTS

| | | | | |
|---|---|---|---|---|
| 6,605,826 B2 * | 8/2003 | Yamazaki et al. | ............... | 257/72 |
| 7,675,233 B2 * | 3/2010 | Lee | ................ | 313/509 |
| 2003/0085405 A1 * | 5/2003 | Park | ................ | 257/72 |
| 2007/0096633 A1 * | 5/2007 | Lee et al. | ...................... | 313/500 |
| 2010/0079718 A1 | 4/2010 | Sekiya et al. | | |

FOREIGN PATENT DOCUMENTS

| | | |
|---|---|---|
| JP | 2010-91896 | 4/2010 |
| KR | 1998-0005467 | 3/1998 |
| KR | 10-2011-0077838 A | 7/2011 |

* cited by examiner

*Primary Examiner* — Galina Yushina
(74) *Attorney, Agent, or Firm* — Lee & Morse, P.C.

(57) ABSTRACT

An organic light-emitting display apparatus includes a thin film transistor having an active layer, a gate electrode, and source and drain electrodes, an organic light-emitting device having a pixel electrode connected to the thin film transistor, an intermediate layer including an emissive layer, and an opposite electrode, and an opposite electrode contact portion having a joining region and an insulating region. The opposite electrode and a power interconnection line contact each other in the joining region. An insulating layer is interposed between the opposite electrode and the power interconnection line in the insulating region, and a portion of the insulating layer penetrates into the power interconnection line in the insulating region.

9 Claims, 4 Drawing Sheets

ORGANIC LIGHT-EMITTING DISPLAY APPARATUS AND METHOD OF MANUFACTURING THE SAME

CROSS-REFERENCE TO RELATED PATENT APPLICATION

This application claims priority under 35 U.S.C. §119 to Korean Patent Application No. 10-2012-0053162, filed on May 18, 2012, in the Korean Intellectual Property Office, the disclosure of which is incorporated herein in its entirety by reference.

BACKGROUND

An organic light-emitting display apparatus may include a thin film transistor and an organic light-emitting device. When an appropriate driving signal is transmitted from the thin film transistor to the organic light-emitting device, the organic light-emitting device emits light to thus embody a desired image.

SUMMARY

Embodiments may be realized by providing an organic light-emitting display apparatus that includes: a thin film transistor including an active layer, a gate electrode, and source and drain electrodes; an organic light-emitting device including a pixel electrode connected to the thin film transistor, an intermediate layer including an emissive layer, and an opposite electrode; and an opposite electrode contact portion including a joining region in which the opposite electrode and a power interconnection line contact each other and an insulating region in which an insulating layer is interposed between the opposite electrode and the power interconnection line. In the insulating region, a portion of the insulating layer penetrates into the power interconnection line.

The power interconnection line may include a first interconnection layer, which is formed on the same plane as the gate electrode, and a second interconnection layer, which is formed on the same plane as the source and drain electrodes above the first interconnection line. A plurality of penetration holes may be formed in the power interconnection line, and a portion of the insulating layer may be filled into the plurality of penetration holes.

The plurality of penetration holes may penetrate from the second interconnection layer to the first interconnection layer. The organic light-emitting display apparatus may further include a pixel-defining layer for defining a pixel region of the organic light-emitting device. The insulating layer may be formed on the same plane as the pixel-defining layer.

Embodiments may also be realized by providing a method of manufacturing an organic light-emitting display apparatus that includes: forming a power interconnection line in which a penetration hole is formed in an opposite electrode contact portion on a substrate; forming an insulating layer, of which a portion is filled into the penetration hole, above the power interconnection line; and forming an opposite electrode above the insulating layer to contact the power interconnection line through a joining region on the power interconnection line, in which the insulating layer does not exist.

The method may further include forming an active layer, a gate electrode, and source and drain electrodes of a thin film transistor. The forming of the power interconnection line may include forming a first interconnection layer on the same plane as the gate electrode by using the same material, and forming a second interconnection layer on the same plane as the source and drain electrodes by using the same material.

A plurality of penetration holes may be formed in the power interconnection line. The plurality of penetration holes may be formed to penetrate from the second interconnection layer to the first interconnection layer. The method may further include forming a pixel-defining layer for defining a pixel region of the organic light-emitting apparatus, wherein the insulating layer is formed on the same plane as the pixel-defining layer.

BRIEF DESCRIPTION OF THE DRAWINGS

Features will become apparent by describing in detail exemplary embodiments thereof with reference to the attached drawings in which.

DETAILED DESCRIPTION

Figure 1:
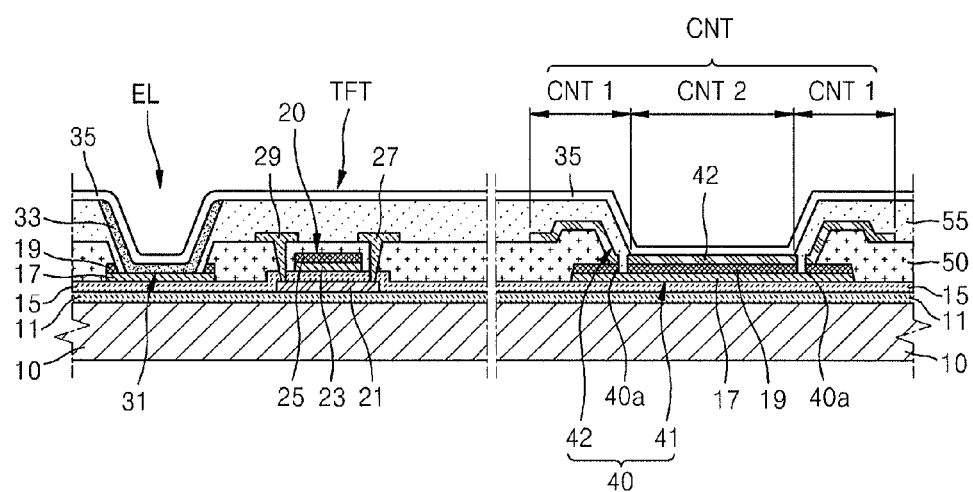
FIG. 1 is a cross-sectional view of an organic light-emitting display apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Expressions such as "at least one of," when preceding a list of elements, modify the entire list of elements and do not modify the individual elements of the list.

Like reference numerals in the drawings refer to like elements. In describing the exemplary embodiments below, if it is rendered that a detailed description about known associated function or structure may make the subject matter unclear, the detailed description will be omitted.

In the drawings illustrating exemplary embodiments, the thickness or size of each layer illustrated in the drawings may be exaggerated for convenience of explanation and clarity. Also, in the present specification, when a constituent element such as a layer, a film, a region, a plate, etc. is located "on" another constituent element, the constituent element should be construed to be located not only "directly on" the other constituent element, but also above the other constituent element through at least one of other constituent elements.

FIG. 1 is a cross-sectional view of a back-emission type organic light-emitting display apparatus according to an exemplary embodiment.

Referring to FIG. 1, the organic light-emitting display apparatus according to the present embodiment includes a thin film transistor TFT, an organic light-emitting device EL, and an opposite electrode contact portion CNT. In the opposite electrode contact portion CNT, an opposite electrode 35 of the organic light-emitting device EL is connected to a power interconnection line 40.

The thin film transistor TFT includes an active layer 21, a gate electrode 20, and source and drain electrodes 27 and 29. The gate electrode 20 may include a lower gate electrode 23 and an upper gate electrode 25. The lower gate electrode 23 is formed of a transparent conductive material, and the upper gate electrode 25 is formed of a metallic material. A gate insulating layer 15 is interposed between the gate electrode 20 and the active layer 21 to insulate the gate electrode 20 from the active layer 21. Also, source and drain regions into which high-concentration impurities are injected are formed on opposing edge portions of the active layer 21, and the source and drain electrodes 27 and 29 are connected to the source and drain regions, respectively.

The organic light-emitting device EL includes a pixel electrode 31 connected to one of the source and drain electrodes 27 and 29 of the thin film transistor TFT, the opposite electrode 35 functioning as a cathode, and an intermediate layer 33 interposed between the pixel electrode 31 and the opposite electrode 35. In FIG. 1, a reference numeral 50 denotes an interlayer insulating layer (hereinafter referred to as a first insulating layer), and a reference numeral 55 denotes a pixel-defining layer (hereinafter referred to as a second insulating layer) for defining a pixel region.

The power interconnection line 40 contacting the opposite electrode 35 is disposed in the opposite electrode contact portion CNT. The power interconnection line 40 includes a first interconnection layer 41 and a second interconnection layer 42. The first interconnection layer 41 and the gate electrode 20 are formed of the same material on the same plane, and the second interconnection layer 42 and the source and drain electrodes 27 and 29 are formed of the same material on the same plane. A region in which the opposite electrode 35 directly contacts the power interconnection line 40 is a contact region CNT2, e.g., in the contact region CNT2 the second insulating layer 55 may be excluded therein by way of a through hole therein. A region in which the second insulating layer 55 is interposed between the opposite electrode 35 and the power interconnection line 40 is an insulating region CNT1. The insulating region CNT1 may be formed so as to enclose the contact region CNT2.

A penetration hole 40a that penetrates to a depth of a portion of the first interconnection layer 41 through the second interconnection layer 42 may be formed in the power interconnection line 40. The penetration hole 40a may expose the first interconnection layer 41, e.g., the penetration hole 40a may expose a layer formed of the transparent conductive material. The insulating region CNT1 may be formed as the second insulating layer 55 is filled into the penetration hole 40a.

That is, the second insulating layer 55 of the insulating region CNT1 electrically isolates the opposite electrode 35 from the power interconnection line 40. In the present embodiment, a joining area is increased by filling a portion of the second insulating layer 55 into the penetration hole 40a, thereby increasing binding strength. Accordingly, since binding strength between the second insulating layer 55 and the power interconnection line 40 is considerably increased, film-separation may be suppressed.

In other words, in the insulating region CNT1, the first insulating layer 50 is interposed between ends of the first and second interconnection layers 41 and 42 as illustrated in FIG. 1, and thus, a step is formed. In this case, stress may easily concentrate on the step, and the concentrated stress may easily cause film-separation in which, e.g., a gap is formed between the second insulating layer 55 and the second interconnection layer 42. However, when the second insulating layer 55 is filled into the penetration hole 40a of the power interconnection line 40, as shown in FIG. 1, a joining area is increased, and thus, binding strength between the second insulating layer 55 and the power interconnection line 40 is increased. Consequentially, film-separation may be suppressed although stress concentrates on the step.

Accordingly, as film-separation is suppressed, a power connection state of the opposite electrode contact portion CNT may be improved to be very stable.

Hereinafter, a method of manufacturing an organic light-emitting display apparatus having a structure as described above is described below with reference to associated drawings.

FIGS. 2A to 2F are cross-sectional views depicting stages in a method of manufacturing the organic light-emitting display apparatus of FIG. 1, according to an exemplary embodiment.

Figure 2A:
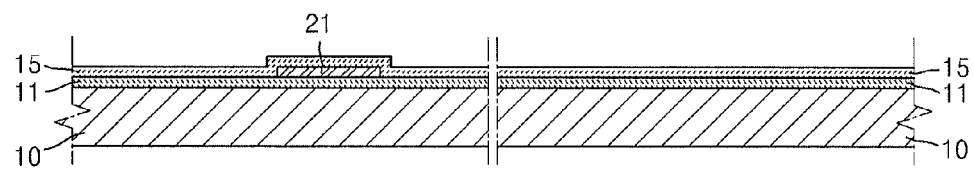
FIGS. 2A to 2F are cross-sectional views depicting stages in a method of manufacturing the organic light-emitting display apparatus of FIG. 1, according to an exemplary embodiment.

First, referring to FIG. 2A, a buffer layer 11, e.g., for flatting the substrate 10 and preventing permeation of impurity elements, is formed on the substrate 10.

The substrate 10 may be formed of a transparent glass material that mainly consists of $SiO_2$. However, the substrate 10 is not limited thereto, and various other substrates formed of, for example, a transparent plastic material or a metallic material, may also be used as the substrate 10.

The active layer 21 of the thin film transistor TFT is formed on the buffer layer 11. The active layer 21 may be formed of a polycrystalline silicon material by patterning using a mask process. Thereafter, the gate insulating layer 15 is formed on the patterned active layer 21. The gate insulating layer 15 may be formed by depositing an inorganic insulating film, such as $SiN_X$ or $SiO_X$, by using, e.g., a chemical vapor deposition process. For example, the chemical vapor deposition process may include plasma-enhanced chemical vapor deposition (PECVD), atmospheric pressure chemical vapor deposition (APCVD), or lower pressure chemical vapor deposition (LPCVD).

Figure 2B:
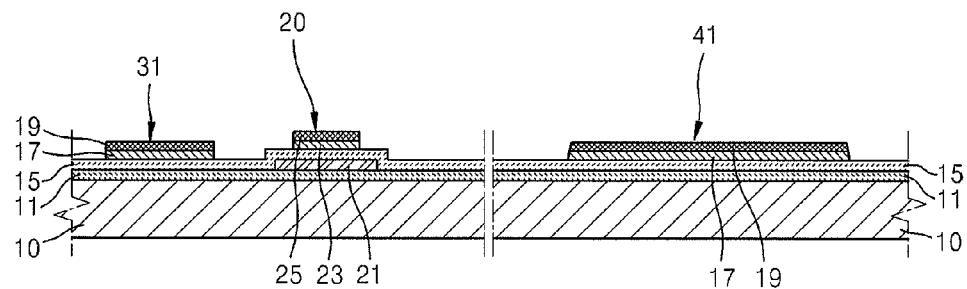

Subsequently, as illustrated in FIG. 2B, a first conductive layer 17 and a second conductive layer 19 are sequentially deposited on the gate insulating layer 15. Then, the pixel electrode 31 of the organic light-emitting device EL, the gate electrode 20 of the thin film transistor TFT, and the first interconnection layer 41 that constitutes the power interconnection line 40 of the opposite electrode contact portion CNT, are formed by patterning the first and second conductive layers 17 and 19.

The first conductive layer 17 may include at least one material selected from ITO, IZO, ZnO, and $In_2O_3$, which may be transparent materials. The second conductive layer 19 may include at least one material selected from Ag, Mg, Al, Pt, Pd, Au, Ni, Nd, Ir, Cr, Li, Ca, Mo, Ti, W, MoW, and Al/Cu.

The first conductive layer 17 and the second conductive layer 19 are sequentially deposited on the whole surface of the substrate 10, and then patterned by using a mask process to form the gate electrode 20, the pixel electrode 31, and the first interconnection layer 41.

The gate electrode 20 corresponds to the center of the active layer 21, and in this form, by using the gate electrode 20 as a mask, the active layer 21 is doped with n-type or p-type impurities, so that a channel portion is formed in a portion of the active layer 21 covered by the gate electrode 20 and source and drain portions are formed in a portion of the active layer exposed by the gate electrode 20.

Figure 2C:
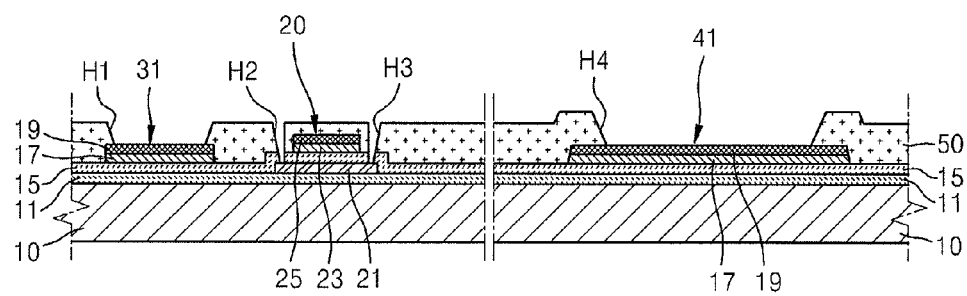

Referring to FIG. 2C, the first insulating layer 50 is deposited on the whole surface of the substrate 10, and openings H1, H2, H3, and H4 are formed therein by using a mask process.

The first insulating layer 50 may be formed by spin coating at least one organic insulating material selected from a polyimide, a polyamide, an acryl resin, a benzocyclobutene, and a phenol resin, and may be formed in a thickness greater than that of the gate insulating layer 15 to function as an interlayer insulating layer between the gate electrode 20 and the source and drain electrodes 27 and 29 of the thin film transistor TFT. Also, the first insulating layer 50 may be formed of, in addition to those organic insulating materials, the inorganic insulating materials which have been described with reference to the gate insulating layer 15. Alternatively, an organic insulating material and an inorganic insulating material may be alternately used to form the first insulating layer 50.

The first insulating layer 50 is patterned to form openings H1, H2, H3, and H4, in which each exposes one of the pixel electrode 31, the source and drain portions of the active layer 21, and the first interconnection layer 41.

Figure 2D:
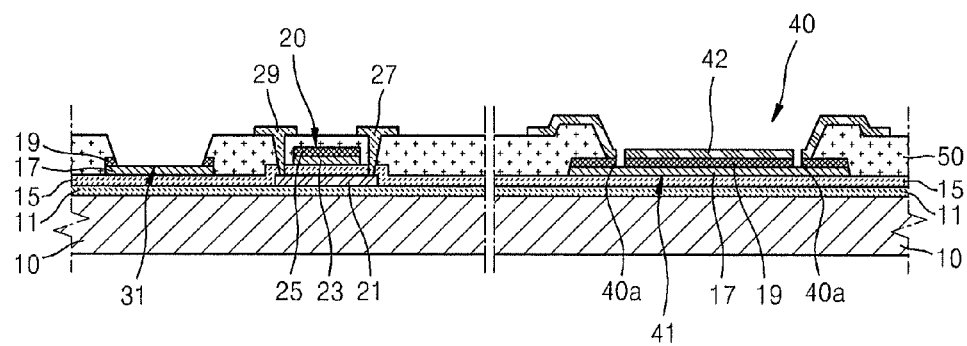

Referring to FIG. 2D, a third conductive layer (not shown) is deposited on the resultant structure and then patterned to form the source and drain electrodes 27 and 29 of the thin film transistor TFT and the second interconnection layer 42 of the power interconnection line 40.

The third conductive layer may be formed of a material selected from the conductive materials described with reference to the first or second conductive layers 17 and 19, or may be formed of an Mo/Al/Mo material. The third conductive layer is patterned to form the source and drain electrodes 27 and 29 and the second interconnection layer 42. The pixel electrode 31 is etched to partially expose the first conductive layer 17, and a penetration hole 40a that penetrates the first and second interconnection layers 41 and 42 is formed in the power interconnection line 40. Also, although not illustrated in the drawings, one of the source and drain electrodes 27 and 29 may be connected to the pixel electrode 31.

Figure 2E:
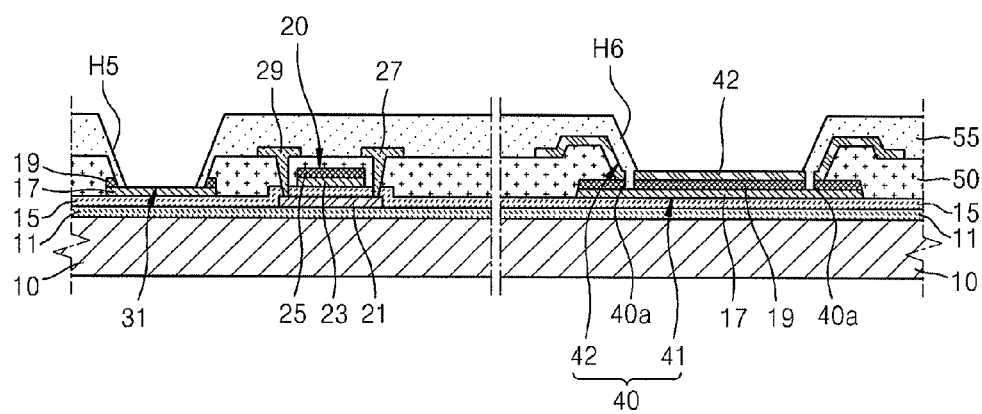

Referring to FIG. 2E, the second insulating layer 55 is formed on the substrate 10. The second insulating layer 55 may be formed by, for example, spin coating at least one organic insulating material selected from a polyimide, a polyamide, an acryl resin, a benzocyclobutene, and a phenol resin. The second insulating layer 55 is filled into the penetration hole 40a. In this form, the second insulating layer 55 is patterned to form openings H5 and H6 respectively exposing a central portion of the pixel electrode 31 and a portion of the second interconnection layer 42.

Figure 2F:
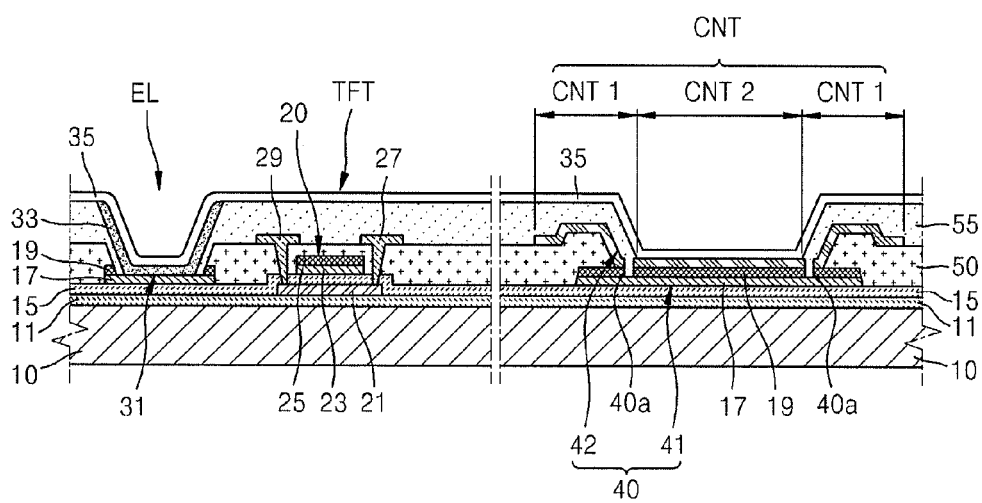

Thereafter, as illustrated in FIG. 2F, the intermediate layer 33 including an organic emissive layer is formed inside the opening H5 exposing the pixel electrode 31. Then, the opposite electrode 35 is formed.

The intermediate layer 33 may include an organic emissive layer (EML), and at least one layer selected from a hole transport layer (HTL), a hole injection layer (HIL), an electron transport layer (ETL), and an electron injection layer (EIL), each of which may have a single- or multi-layered structure.

The opposite electrode 35 is deposited on the whole surface of the substrate 10, and in this case, the opposite electrode 35 contacts the second interconnection layer 42 of the power interconnection line 40 through the opening H6.

By performing these processes described above, a structure in which the second insulating layer 55 of the opposite electrode contact portion CNT is filled into the penetration hole 40a may be formed, and thus, film-separation, that is, separation of the second insulating layer 55 or the opposite electrode 35 deposited on the power interconnection line 40 may be prevented.

Figure 3:
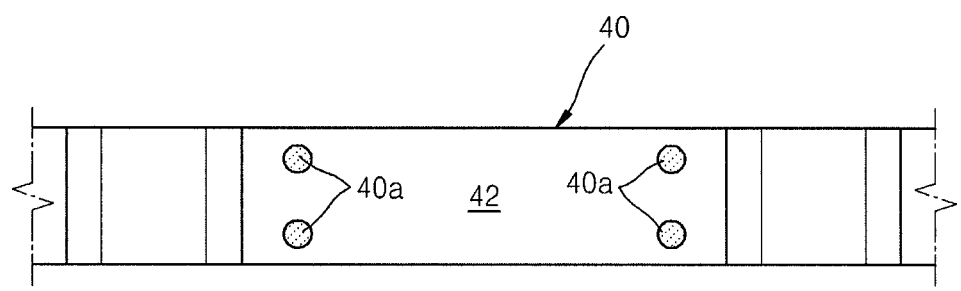
FIG. 3 is a plan view schematically illustrating a structure of penetration hole arrangement of an opposite electrode contact portion in the organic light-emitting display apparatus of FIG. 1.

A plurality of penetration holes 40a may be formed in the power interconnection lines 40 as schematically illustrated in the plan view of FIG. 3. Increasing the number of penetration holes 40a so that a contact area contacting the second insulation layer 55 is increased, may realize an improved effect of suppressing the film-separation stated above.

As described above, according to organic light-emitting display apparatuses and methods of manufacturing the same according to exemplary embodiments, the possibility of film-separation, which may occur in an opposite electrode contact portion, may be reduced and/or prevented. Accordingly, a stable power connection to an opposite electrode may be obtained. Further, due to the increased area of a contact portion, resistance may be reduced and a voltage drop may be reduced and/or prevented.

By way of summation and review, an organic light-emitting display apparatus may include a thin film transistor and an organic light-emitting device. The thin film transistor may include an active layer, a gate electrode, and source and drain electrodes, which all are stacked on a substrate. Accordingly, when a current is supplied to the gate electrode via an interconnection line formed on the substrate, a current flows in the source and drain electrodes via the active layer. Further, a current flows in a pixel electrode of the organic light-emitting device connected to the source and drain electrodes.

The organic light-emitting device of the organic light-emitting display apparatus may include the pixel electrode, an opposite electrode facing the pixel electrode, and an emissive layer interposed between the pixel electrode and the opposite electrode. When the current flows in the pixel electrode via the thin film transistor, an appropriate voltage level is formed between the opposite electrode and the pixel electrode, and thus, the emissive layer emits light to embody an image.

To form the appropriate level of voltage in the emissive layer, the opposite electrode may retain an appropriate voltage level by connection with a power interconnection line. However, film-separation may occur at a contact portion of the opposite electrode and the power interconnection line.

For example, the power interconnection line connected to the opposite electrode may include a plurality of interconnection layers, and an insulating layer may be interposed between ends of the interconnection layers. In this structure, the end of the power interconnection line with the insulating layer interposed between the interconnection layers protrudes more than a central portion of the power interconnection line, thereby forming a step. Accordingly, another insulating layer covering the ends of the power interconnection line and the opposite electrode, which is formed on the insulating layer to contact the power interconnection line, do not completely contact the power interconnection line due to the step, and thus, a gap may be formed therebetween resulting in film-separation. Once film-separation occurs, power connection to the opposite electrode may be unstable, thereby causing defects in products due to the generation of heat.

In contrast, embodiments relate to an organic light-emitting display apparatus and to an organic light-emitting display apparatus in which the structure of an opposite electrode contacting an interconnection line is improved. Further, the improved structure, e.g., for suppressing film-separation at a contact portion of an opposite electrode, may embody a stable organic light-emitting display apparatus.

Embodiments also relate to an organic light-emitting display apparatus that is improved to suppress an occurrence of film-separation at an opposite electrode contact portion, and a method of manufacturing the organic light-emitting display apparatus. Embodiments further relate to an organic light-emitting display apparatus in which a structure may increase a binding strength of the insulating layer, and thus, film-separation may be suppressed. Embodiments also relate to an organic light-emitting display apparatus in which film-separation at an opposite electrode contact portion may be suppressed, and thus, stable power connection to an opposite electrode may be secured, thereby reducing defects in products.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light-emitting display apparatus, comprising:
   a thin film transistor including an active layer, a gate electrode, and source and drain electrodes;
   an organic light-emitting device including a pixel electrode, an intermediate layer having an emissive layer, and an opposite electrode; and
   an opposite electrode contact portion including a joining region and an insulating region,
   the opposite electrode and a power interconnection line contacting each other in the joining region, and
   an insulating layer being interposed between the opposite electrode and the power interconnection line in the insulating region, a portion of the insulating layer penetrating into the power interconnection line in the insulating region,
   wherein the power interconnection line includes a plurality of penetration holes therein, the portion of the insulating layer being filled into the plurality of penetration holes.

2. The organic light-emitting display apparatus of claim 1, wherein the power interconnection line includes:
   a first interconnection layer that is formed on a same plane as the gate electrode, and
   a second interconnection layer that is above the first interconnection layer, the second interconnection layer being formed on a same plane as the source and drain electrodes.

3. The organic light-emitting display apparatus of claim 2, wherein the portion of the insulating layer penetrates into the second interconnection layer.

4. The organic light-emitting display apparatus of claim 2, wherein the plurality of penetration holes penetrate from the second interconnection layer to the first interconnection layer.

5. The organic light-emitting display apparatus of claim 4, further comprising a pixel-defining layer for defining a pixel region of the organic light-emitting device, the insulating layer being formed on a same plane as the pixel-defining layer.

6. A method of manufacturing an organic light-emitting display apparatus, the method comprising:
   forming an active layer, a gate electrode, and source and drain electrodes of a thin film transistor;
   forming an organic light-emitting device including a pixel electrode, an intermediate layer having an emissive layer, and an opposite electrode;
   forming a power interconnection line in which a plurality of penetration holes are formed in an opposite electrode contact portion on a substrate;
   forming an insulating layer above the power interconnection line, a portion of the insulating layer being filled into the plurality of penetration holes in an insulating region; and
   forming an opposite electrode above the insulating layer, the opposite electrode contacting the power interconnection line through a joining region on the power interconnection line, the insulating layer being excluded in the joining region, the insulating layer interposed between the opposite electrode and the power interconnection line in the insulating region.

7. The method of claim 6,
   wherein forming the power interconnection line includes:
   forming a first interconnection layer on a same plane as the gate electrode by using a same gate electrode forming material; and
   forming a second interconnection layer on a same plane as the source and drain electrodes by using a same source and drain electrode forming material.

8. The method of claim 7, wherein the plurality of penetration holes are formed to penetrate from the second interconnection layer to the first interconnection layer.

9. The method of claim 8, further comprising forming a pixel-defining layer for defining a pixel region of the organic light-emitting apparatus, the insulating layer being formed on a same plane as the pixel-defining layer.

\* \* \* \* \*